United States Patent
Masuda

(10) Patent No.: US 8,542,077 B2
(45) Date of Patent: Sep. 24, 2013

(54) HIGH-FREQUENCY CIRCUIT

(75) Inventor: Kazutoshi Masuda, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 428 days.

(21) Appl. No.: 13/009,221

(22) Filed: Jan. 19, 2011

(65) Prior Publication Data

US 2011/0298562 A1    Dec. 8, 2011

(30) Foreign Application Priority Data

Jun. 4, 2010  (JP) .................................. 2010-128954

(51) Int. Cl.
*H03H 7/38* (2006.01)
(52) U.S. Cl.
USPC .......................................................... 333/32
(58) Field of Classification Search
USPC ................... 333/32; 330/277, 286, 295, 302, 330/307
See application file for complete search history.

(56) References Cited

U.S. PATENT DOCUMENTS 6,281,756 B1    8/2001  Goto et al.

FOREIGN PATENT DOCUMENTS

| JP | 2001-24148 | 1/2001 |
|----|------------|--------|
| JP | 2002-335136 | 11/2002 |

OTHER PUBLICATIONS

Office Action issued May 8, 2012, in Japanese Patent Application No. 2010-128954 (with partial English-language translation).

*Primary Examiner* — Stephen Jones
(74) *Attorney, Agent, or Firm* — Oblon, Spivak, McClelland, Maier & Neustadt, L.L.P.

(57) ABSTRACT

A high-frequency circuit according to one embodiment of the present invention includes a plurality of transistors, a plurality of input matching circuits, a plurality of output matching circuits, a plurality of resistors, and low-frequency oscillation suppressing circuits. The transistors are arranged on a substrate in parallel. The input matching circuits and output matching circuits are arranged on insulating substrates and connected to the transistors. The oscillation suppressing circuits are a circuit configured by a filter circuit having a desired transmission band and a resistor, and are connected to gate terminals of transistors located on both sides of the transistors, respectively. Each of resistors is formed to include a position closest to the transistor between the input matching circuits and between the output matching circuits. Furthermore, each of resistors has a length at which the oscillation suppressing circuit can suppress oscillation at the lowest frequency in the transmission band.

10 Claims, 7 Drawing Sheets

HIGH-FREQUENCY CIRCUIT

CROSS REFERENCE TO RELATED APPLICATIONS

This application is based upon and claims the benefit of priority from the prior Japanese Patent Application No. 2010-128954 filed in Japan on Jun. 4, 2010; the entire contents of which are incorporated herein by reference.

FIELD

Embodiments described herein relate generally to a high-frequency circuit.

BACKGROUND

A conventional high-frequency circuit is configured by mounting a plurality of transistors arranged and formed on a semiconductor substrate in parallel to each other and matching circuits arranged on an insulating substrate in a package.

The matching circuits are configured by one input matching circuit and one output matching circuit. The input matching circuit is commonly connected to gate terminals of the plurality of transistors, and the output matching circuit is commonly connected to drain terminals of the plurality of transistors.

When high-frequency signals are input to the conventional high-frequency circuit, some high-frequency signals oscillate at various oscillation frequencies depending on frequency bands held by the signals in the circuit.

For this reason, for example, in order to suppress a signal from oscillating at a GHz-order high oscillation frequency, each of an input matching circuit and an output matching circuit is divided into a plurality of circuits, and the divided matching circuits are connected to each other with resistors (isolation resistors). Oscillation at a high oscillation frequency occurs in a closed loop (electrically closed path for a high-frequency signal) formed by two adjacent transistors, input matching circuits connected to the transistors, and output matching circuits connected to the transistors. This closed loop includes a position closest to a transistor between the input matching circuits and between the output matching circuits. Therefore, the isolation resistor is arranged at only a position closest to the transistor between the matching circuits.

Furthermore, for example, in order to suppress oscillation from occurring at a low MHz-order oscillation frequency, low-frequency oscillation suppressing circuits are connected to gate terminals of transisotors, located on both the sides, of the plurality of transistors which are arranged in parallel to each other. The low-frequency oscillation suppressing circuit is configured by connecting an inductor L, a resistor R, and a capacitor C in series with each other.

However, in the conventional high-frequency circuit, a plurality of isolation resistors are arranged from a transistor located near the center to the low-frequency oscillation suppressing circuit. Therefore, a resistance of a path through which a signal is transmitted between the transistor near the center and the low-frequency oscillation suppressing circuit increases. Therefore, the low-frequency oscillation suppressing circuit is not substantially connected to the transistor located near the center. For this reason, the low-frequency oscillation suppressing circuit does not act on the transistor located near the center. Therefore, there is a problem that it is difficult for the conventional high-frequency circuit to suppress oscillation at a low oscillation frequency.

Furthermore, in order to avoid the problem, when each of the input matching circuit and the output matching circuit is not divided into a plurality of circuits, it is difficult to suppress oscillation at a high oscillation frequency.

More specifically, in a conventional high-frequency circuit, it is difficult to suppress oscillation at a high oscillation frequency and oscillation at a low oscillation frequency.

DETAILED DESCRIPTION

Figure 1:
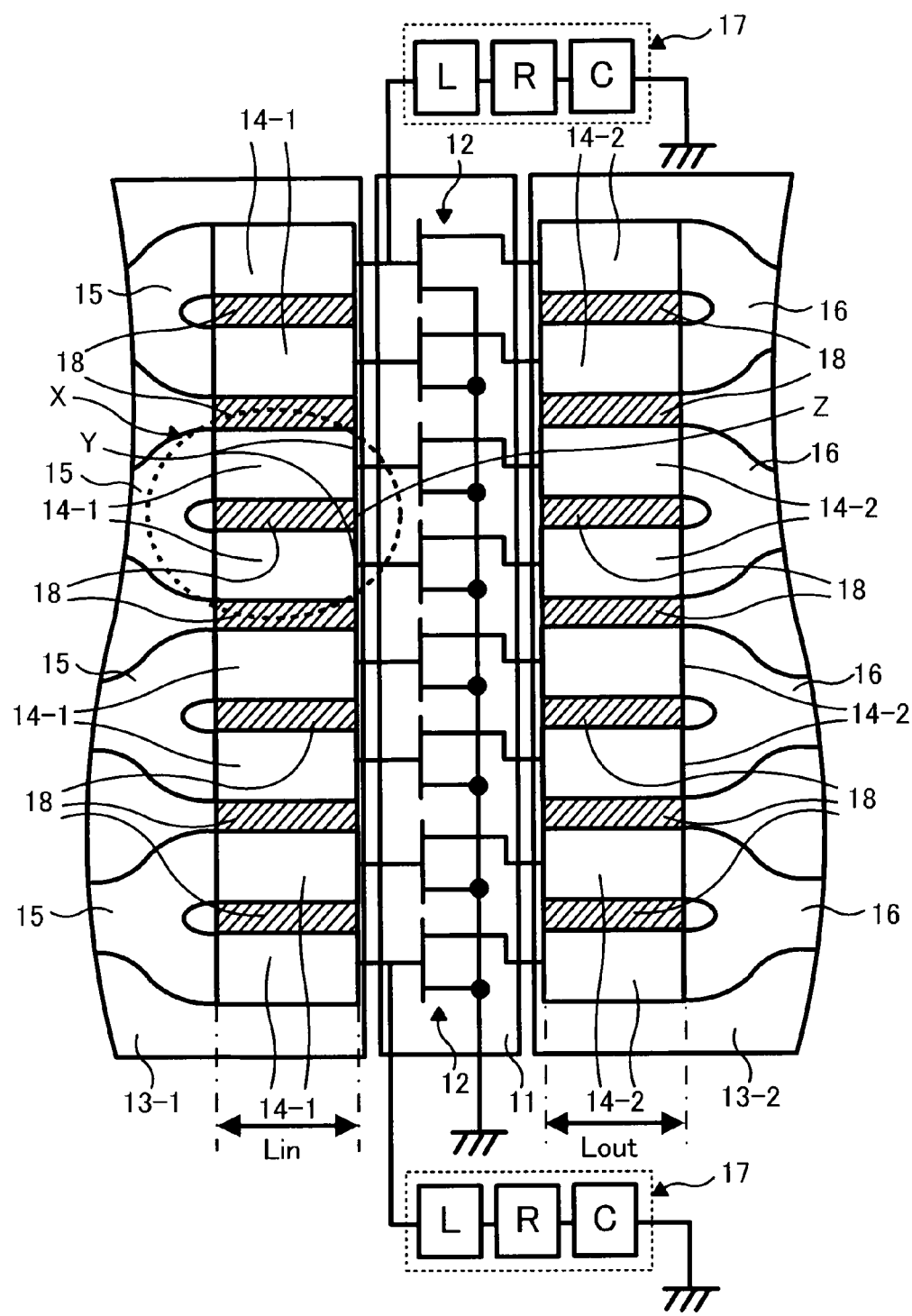
FIG. 1 is a top view schematically showing a main part of the high-frequency circuit according to the embodiment of the present invention.

A high-frequency circuit according to one embodiment of the present invention includes a plurality of transistors, a plurality of input matching circuits, a plurality of output matching circuits, a plurality of resistors, and low-frequency oscillation suppressing circuits. The plurality of transistors are arranged and formed on a substrate in parallel to each other. The plurality of input matching circuits are formed on the first insulating substrate and connected to gate terminals of the plurality of transistors. The plurality of output matching circuits are formed on a second insulating substrate and connected to drain terminals of the plurality of terminals. The low-frequency oscillation suppressing circuits are configured by a filter circuit having a desired transmission band and a resistor, respectively. The low-frequency oscillation suppressing circuit has one end connected to gate terminals of the transistors, located on both the sides, of the plurality of transistor and the other end which is grounded. Each of the plurality of resistors is formed to include a position closest to the transistor between the input matching circuits and between the output matching circuits. Furthermore, each of the plurality of resistors has a length at which the low-frequency oscillation suppressing circuit can suppress oscillation at the lowest frequency in the transmission band. The high-frequency circuit will be described below with reference to the drawing.

FIG. 1 is a top view schematically showing a main part of the high-frequency circuit according to the embodiment of the present invention. As shown in FIG. 1, the high-frequency circuit according to the embodiment has a plurality of transistors 12, an input matching circuit 14-1, and an output matching circuit 14-2. The high-frequency circuit is mounted inside, for example, a package (not shown).

The plurality of transistors 12 are arranged and formed on a semiconductor substrate 11 in parallel to each other. The plurality of transistors 12 are, for example, field effect transistors (FET) and may be, for example, high electron mobility transistors (HEMT).

On the input side of the plurality of transistors 12, on a gate terminal side of the plurality of transistors 12, the input matching circuit 14-1 is arranged. Input matching circuit 14-1 is divided into circuits equal to, for example, the number of transistors 12. The plurality of divided input matching circuits 14-1 are arranged and formed on a first insulating substrate 13-1. The plurality of input matching circuits 14-1 are electrically connected to the gate terminals of the transistors 12 by, for example, conductors (not shown) such as wires.

A plurality of 1-input-2-output branching filters 15 are arranged on the first insulating substrate 13-1. An output terminal of each of the branching filters 15 is connected to the two adjacent input matching circuits 14-1. The input terminal of each of the branching filters 15 is finally connected to an input terminal of the high-frequency circuit through, for example, a plurality of branching filters (not shown) which are connected in the form of a pyramid.

The plurality of branching filters 15 connected to the input matching circuit 14-1 and the plurality of branching filters (not shown) connected in the form of a pyramid may be formed on a substrate different from the first insulating substrate 13-1.

With an input-side configuration of the high-frequency circuit described above, a high-frequency signal input to an input terminal of the high-frequency circuit is divided into a plurality of signals by the plurality of branching filters (not shown) connected in the form of a pyramid and the plurality of branching filters 15 connected to the input matching circuits 14-1, and the signals are input to the input matching circuits 14-1.

On an output side of the plurality of transistors 12, i.e., on the drain terminal side of the plurality of transistors 12, output matching circuit 14-2 is arranged. The output matching circuit 14-2 is divided into circuits equal to the number of transistors 12. The plurality of divided output matching circuits 14-2 are arranged and formed on a second insulating substrate 13-2. The plurality of divided output matching circuits 14-2 are electrically connected to the drain terminals of the transistors 12 by conductors (not shown) such as wires, respectively.

A plurality of 2-input-1-output combining filters 16 are arranged on the second insulating substrate 13-2. The input terminal of each of the combining filters 16 is connected to the two adjacent output matching circuits 14-2. The output terminal of each of the combining filters 16 is finally connected to an output terminal of the high-frequency circuit through, for example, a plurality of combining filters (not shown) which are connected in the form of a pyramid.

The plurality of combining filters 16 connected to the output matching circuit 14-2 and the plurality of combining filters (not shown) connected in the form of a pyramid may be formed on a substrate different from the second insulating substrate 13-2.

With an output-side configuration of the high-frequency circuit described above, a plurality of high-frequency signals output from each of the output matching circuits 14-2 are combined by the plurality of combining filters 16 connected to the output matching circuit 14-2 and the plurality of combining filters (not shown) connected in the form of a pyramid and output from the output terminal of the high-frequency circuit.

The high-frequency circuit has a low-frequency oscillation suppressing circuit 17 and a resistor 18 which functions as an isolation resistor. The low-frequency oscillation suppressing circuit 17 and the resistor 18 suppress some of input high-frequency signals input to the circuit from oscillating in the circuit. The low-frequency oscillation suppressing circuit 17 and the resistor 18 will be described below.

The resistor 18 is an isolation resistor to suppress oscillation at, for example, a high GHz-order oscillation frequency. As shown in FIG. 1, the resistor 18 is arranged to fill in portions between the plurality of divided input matching circuits 14-1. More specifically, when a length (length in a direction parallel to a direction in which a high-frequency signal flows) of the input matching circuit 14-1 is represented by Lin, the resistor 18 is arranged to have a length Lin. The length of the resistor 18 means a length of the input matching circuit 14-1 (output matching circuit 14-2) in the same direction of the longitudinal direction.

Similarly, the resistor 18 is arranged to fill in portions between the plurality of divided output matching circuits 14-2. More specifically, when a length of the output matching circuit 14-2 (length in a direction parallel to a direction in which a high-frequency signal flows) is represented by Lout, the resistor 18 is arranged to have a length Lout.

The resistor 18 arranged as described above consists of, for example, tantalum nitride, nichrome, or the like.

The length Lin of the input matching circuit 14-1 and the length Lout of the output matching circuit 14-2 are normally equal to each other. However, the relation between the lengths is not limited thereto.

The low-frequency oscillation suppressing circuit 17 is a circuit to suppress oscillation at, for example, a low MHz-order oscillation frequency. The circuit 17 is configured by a filter circuit including an inductor L and a capacitor C connected in series with each other and a resistor R. The low-frequency oscillation suppressing circuit 17 is a circuit in which, for example, the inductor L, the resistor R, and the capacitor C are connected in series with each other in the this order. One end of the low-frequency oscillation suppressing circuit 17 is connected to the gate terminals of the transistors 12 (uppermost and lowermost transistors 12 in the drawing), arranged on both the sides, of the plurality of transistors 12, and the other end is grounded.

The resistor R and the capacitor C configuring the low-frequency oscillation suppressing circuit 17 are a resistor element and a capacitor element, respectively. The inductor L is a conductor wire which connects, for example, the gate terminals of the transistors 12 and the resistor elements to each other.

Figure 2:
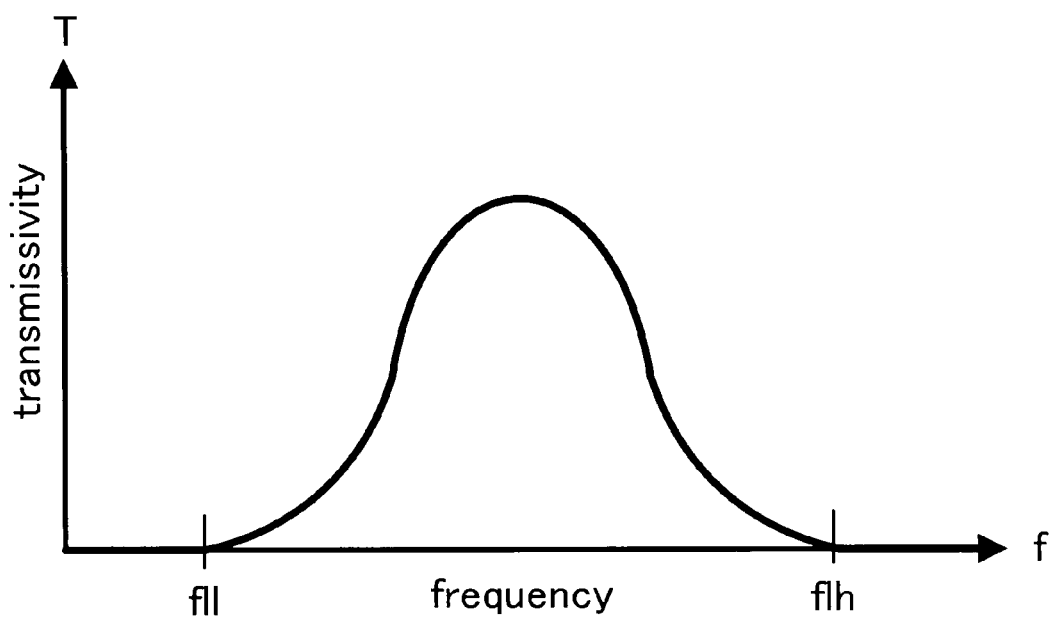
FIG. 2 is a graph showing a transmission characteristic of a low-frequency oscillation suppressing circuit used in the high-frequency circuit in FIG. 1.

Furthermore, the low-frequency oscillation suppressing circuit 17 will be described. FIG. 2 is a diagram showing a transmission characteristic to a frequency of a signal input to the low-frequency oscillation suppressing circuit 17, where the abscissa and the ordinate denote a frequency and a transmittance, respectively. As shown in FIG. 2, the low-frequency oscillation suppressing circuit 17 is a circuit 17 having a frequency band (transmission band) (fll to flh in the drawing) in which a low-frequency component of a high-frequency signal can be transmitted. The transmission band can be determined by adjusting a filter circuit (adjusting an inductance of the inductor L and a capacitance of the capacitor C).

In this case, the resistor 18 must operate the low-frequency oscillation suppressing circuit 17 to the transistor 11 near the center of the semiconductor substrate 11 and must be formed to be long enough to suppress oscillation at a frequency in the transmission band the low-frequency oscillation suppressing circuit 17 has. Under the conditions, the resistor is preferably formed as follows.

The resistor 18 is preferably formed at a position closest to at least the transistors 12 between each of the matching circuits 14-1 and 14-2 to suppress oscillation at a maximum oscillation frequency. The position closest to the transistors 12 means a position described below. For example, the two rectangular input matching circuits 14-1 arranged in x of a part in FIG. 1. Of four sides configuring the shape of each of the input matching circuits 14-1, one side closest to the transistors 12 is defined as a side Y. At this time, between the input matching circuits 14-1, the position closest to the transistor 12 means a position on a straight line Z connecting the two sides Y. More specifically, the resistor 18 is preferably formed on at least the straight line Z between the input matching circuits 14-1.

The resistor 18 is preferably formed between each of the matching circuits 14-1 and 14-2 to have a maximum length to suppress oscillation at a minimum oscillation frequency.

Therefore, the length of the resistor 18 is not necessarily Lin or Lout. For example, the resistor 18 may be formed as follows.

Figure 3:
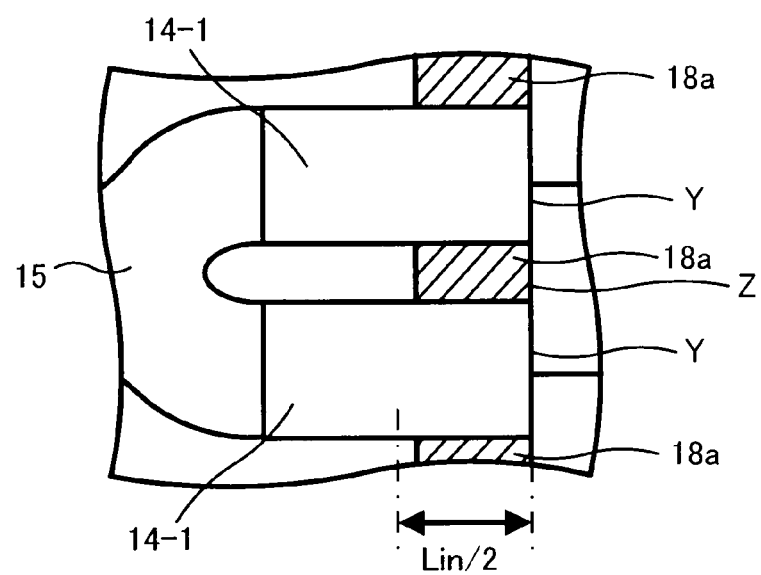
FIG. 3 is a top view showing an enlarged part of the high-frequency circuit in FIG. 1 in which a resistor according to a first modification is arranged.
Figure 4:
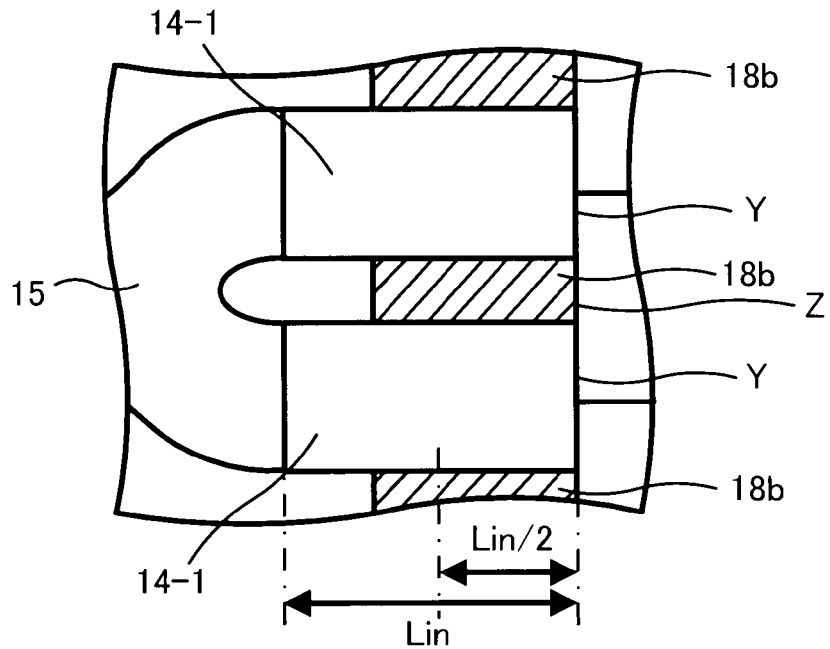
FIG. 4 is a top view showing an enlarged part of the high-frequency circuit in FIG. 1 in which a resistor according to a second modification is arranged.
Figure 5:
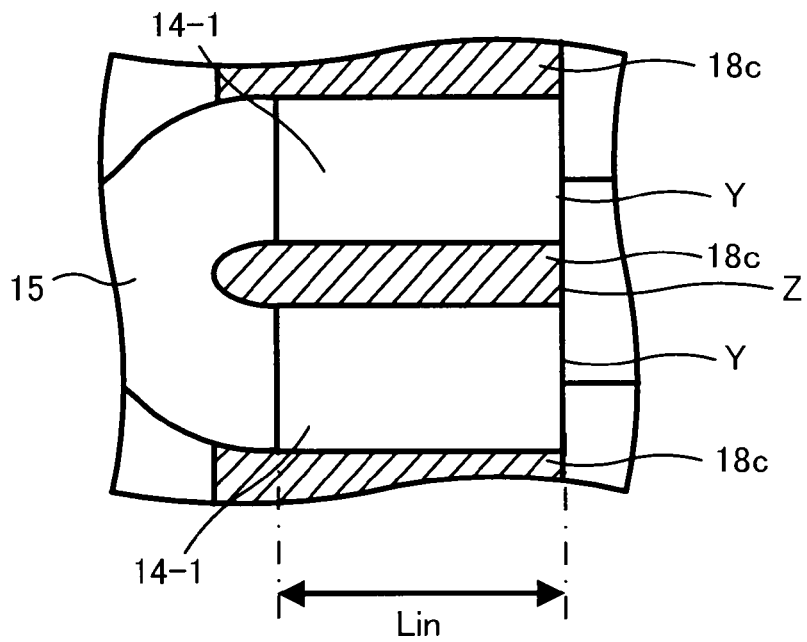
FIG. 5 is a top view showing an enlarged part of the high-frequency circuit in FIG. 1 in which a resistor according to a third modification is arranged.

FIGS to 3 to 5 are top views an enlarged part x of the high-frequency circuit in FIG. 1 in which resistors 18a, 18b, and 18b according to the first to third modifications. As shown in FIG. 3, for example, the resistor 18a between the input matching circuits 14-1 may be formed to have a length which is almost smaller than a half the length Lin of the input matching circuit 14-1. As shown in FIG. 4, for example, the resistor 18b between the input matching circuits 14-1 may be formed to have a length which is almost shorter than the length Lin of the input matching circuit 14-1 and longer than a half the length Lin of the input matching circuit 14-1. As shown in FIG. 5, for example, the resistor 18c between the input matching circuits 14-1 is formed to have a length larger than that of the input matching circuit 14-1. The similar resistors 18a, 18b, and 18c may be arranged between the output matching circuits 14-2.

However, in order to suppress oscillation at an oscillation frequency as wider band as possible, the resistor 18b shown in FIG. 4 is preferable rather than the resistor 18a shown in FIG. 3. The resistor 18 shown in FIG. 1 is more preferable than the resistor 18b shown in FIG. 4. Furthermore, the resistor 18c shown in FIG. 5 is more preferable than the resistor 18 shown in FIG. 1.

As described above, the reason why the resistors 18 (18a, 18b, and 18c) are arranged will be described later.

Figure 6:
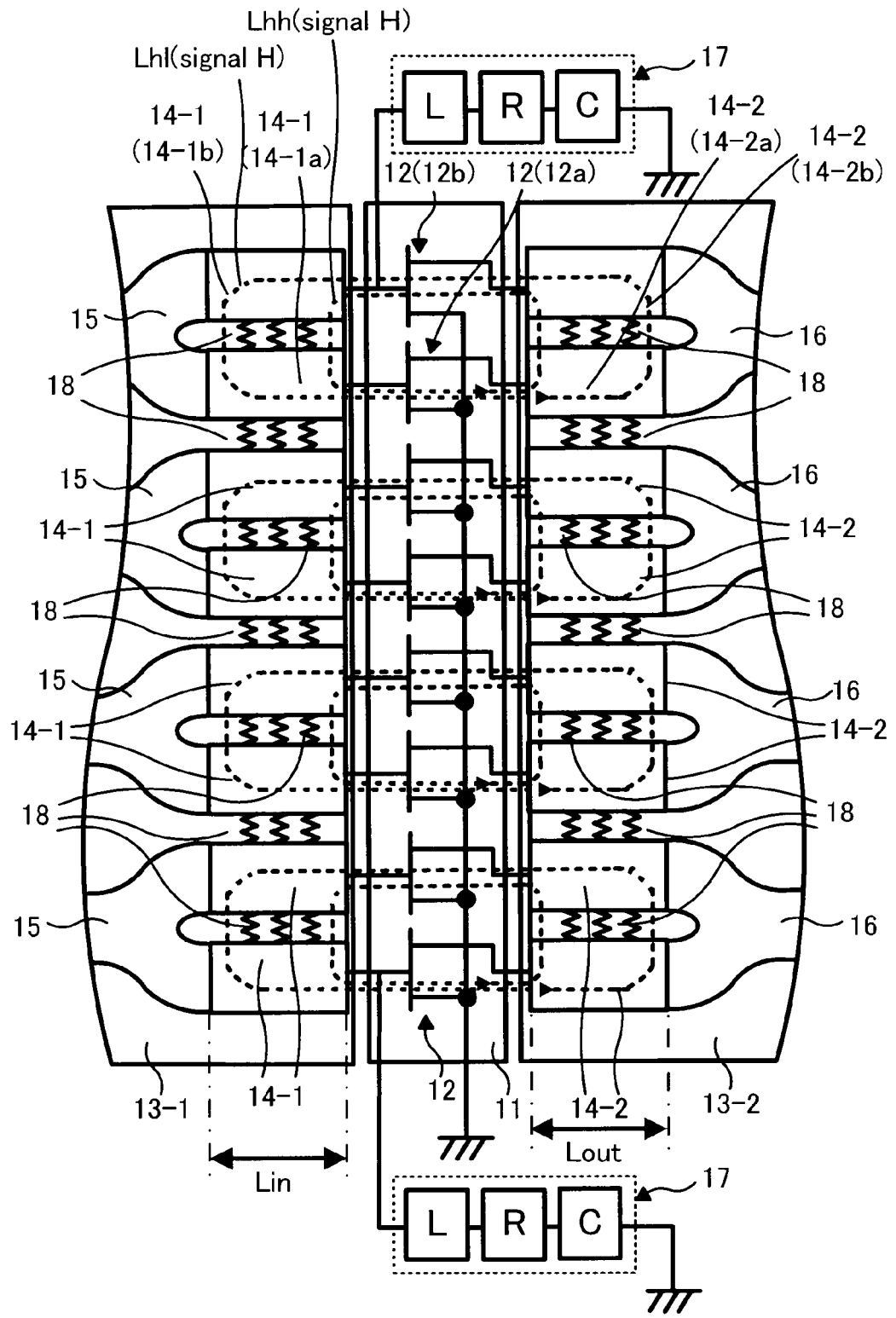
FIG. 6 is a diagram for explaining an operation of suppressing oscillation of a high oscillation frequency and an equivalent circuit in FIG. 1.

According to the high-frequency circuit described above, the reason why oscillation at a high oscillation frequency can be suppressed will be described below with reference to FIG. 6. FIG. 6 is a diagram for explaining suppression of oscillation at a high oscillation frequency, and is an equivalent circuit in FIG. 1. Dotted lines Lhh and Lhl in the drawing denote closed loops (electrically closed paths of a high-frequency signal) in which oscillation occurs at a high oscillation frequency.

A principle that causes oscillation to occur at a high oscillation frequency with attention to two transistors 12a and 12b shown in FIG. 6. When a high-frequency signal is input to the high-frequency circuit, for example, a high GHz-order frequency component (hereinafter referred to as a signal H) of the high-frequency signal is branched by the branching filter 15, and the branched signals are input to the transistors 12a and 12b. Since the transistors 12a and 12b have slightly different performances on the basis of, for example, a manufacturing error or the like, signals H output from the transistors 12a and 12b have a phase difference. The signals H are input to output matching circuits 14-2a and 14-2b with different phases. Therefore, a potential difference is generated between the output matching circuit 14-2a and the output matching circuit 14-2b. In this manner, the signal H output from the transistor 12a is transmitted to the output matching circuit 14-2b connected to the transistor 12b through the output matching circuit 14-2a connected to the transistor 12a and the resistor 18. Since a drain-gate interval of the transistors 12a and 12b is equivalent to a capacitor to the signal H, some of the signals H transmitted to the output matching circuit 14-2b are transmitted to the input matching circuit 14-1b connected to the transistor 12b through the transistor 12b. When the signal H is transmitted to the input matching circuit 14-1b, a potential difference is generated between the input matching circuit 14-1b and the input matching circuit 14-1a connected to the circuit 14-1b through the resistor 18. Therefore, the signal H is transmitted to the input matching circuit 14-1a through the resistor 18. With the flow of the above signal H, the closed loops Lhh and Lhl are formed, and the signal H tries to oscillate in the closed loops Lhh and Lhl.

However, electric powers of the signals H transmitted on the closed loops Lhh and Lhl are attenuated each times the signals H pass through the resistor 18. Therefore, oscillation at a high oscillation frequency is suppressed.

The higher the frequencies of the signals H are, the shorter the closed loops Lhh and Lhl are. Therefore, a higher-frequency component of the signal H forms the closed loop Lhh including a position close to the transistor 12 between the input matching circuits 14-1 and between the output matching circuits 14-2. Therefore, in order to widen a frequency band in which oscillation can be suppressed by the resistor 18 on a high-frequency side as much as possible, the resistor 18 is preferably arranged at a position closest to the transistor 12 between the input matching circuits 14-1 and between the output matching circuits 14-2.

On the other hand, a lower-frequency component of the signal H forms the closed loop Lhl including a position far from the transistor 12 between the input matching circuits 14-1 and between the output matching circuits 14-2. Therefore, in order to widen a frequency band in which oscillation can be suppressed by the resistor 18 on a low-frequency side as much as possible, the resistor 18 is preferably arranged to have as large a length as possible between the input matching circuits 14-1 and between the output matching circuits 14-2.

Figure 7:
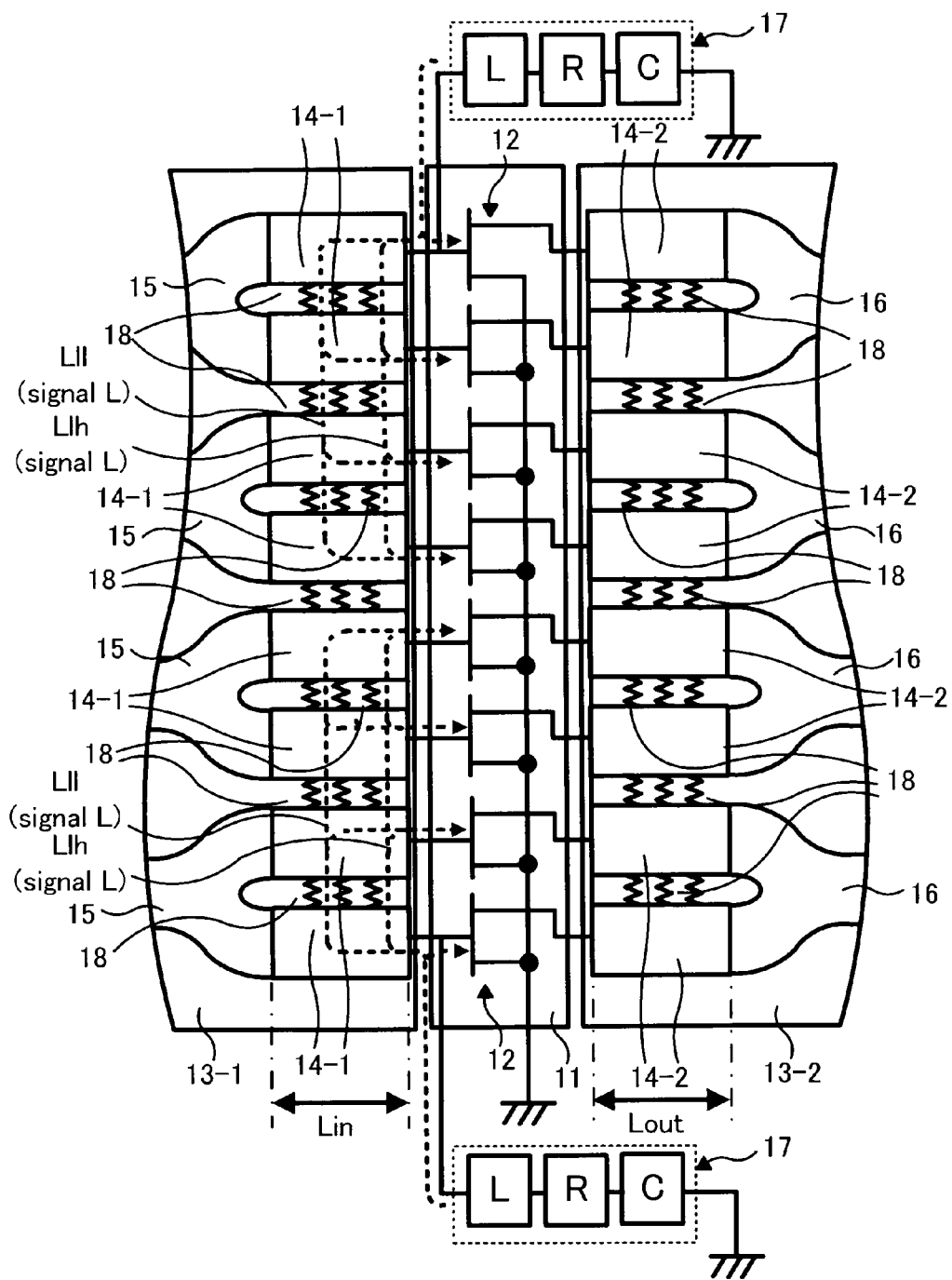
FIG. 7 is a diagram for explaining an operation of suppressing oscillation at a low oscillation frequency and an equivalent circuit in FIG. 1.

The reason why oscillation at a low oscillation frequency can be suppressed by the high-frequency circuit will be described below with reference to FIG. 7. FIG. 7 is a diagram for explaining suppression of oscillation at a low oscillation frequency, and is an equivalent circuit in FIG. 1. Dotted lines Llh and Lll in the drawing denote paths on which the low-frequency oscillation suppressing circuit 17 acts on each of the transistors 12.

When a high-frequency signal is input to a high-frequency circuit, for example, a low MHz-order frequency component (hereinafter referred to as a signal L) of the high-frequency signal is repeatedly reflected between the gate terminal of the transistor 12 and a bias power supply circuit (not shown) arranged outside the high-frequency circuit to supply a bias to the transistor 12, and the low-frequency components tries to oscillate between the transistor 12 and the bias power supply circuit. However, since the low-frequency oscillation suppressing circuit 17 is connected to the gate terminal of the transistor 12, some of signals L are transmitted to the low-frequency oscillation suppressing circuit 17. The electric power of the signal L transmitted to the circuit 17 is attenuated by the resistor R. Therefore, oscillation at a low oscillation frequency is suppressed.

In order to cause the low-frequency oscillation suppressing circuit 17 to act on the transistor 12 near the center of the semiconductor substrate 11, the low-frequency oscillation suppressing circuit 17 and the transistor 12 near the center may be electrically connected to each other. In order to electrically connect the low-frequency oscillation suppressing circuit 17 to the transistor 12 near the center, resistances of the plurality of resistors 18 between low-frequency oscillation suppressing circuit 17 and the transistor 12 may be preferably small. The longer each of the resistors 18 are, the smaller the resistance of each of the resistors 18 are. Therefore, the resistor 18 must be formed to be longer enough to cause the low-frequency oscillation suppressing circuit 17 to act on the transistor 12 at the center.

The low-frequency oscillation suppressing circuit 17 is a circuit which suppresses oscillation of the signal L at a frequency in a transmission band (fll to flh in FIG. 2) of the filter circuit. Paths in which the low-frequency oscillation suppressing circuit 17 acts on the transistor 12 change depending on the frequencies of the signals L.

For example, a path in which the low-frequency oscillation suppressing circuit 17 operates to suppress a frequency component of the signal L coinciding with the highest frequency flh in the transmission band of the low-frequency oscillation suppressing circuit 17 is a path indicated by a dotted line Llh in the drawing in which a length between the circuit 17 and the transistor 12 is short.

A path in which the low-frequency oscillation suppressing circuit 17 operates to suppress oscillation of a frequency component of the signal L coinciding with the lowest frequency fll in the transmission band of the low-frequency oscillation suppressing circuit 17 is a path indicated by a dotted line Lll in the drawing in which a length between the circuit 17 and the transistor 12 is long.

Therefore, the resistor 18 must be formed to be long so as to include portions on the paths Lll and Llh in which the low-frequency oscillation suppressing circuit 17 operates.

As described above, under the condition in which the resistor 18 is formed long, the resistor 18 is preferably formed as follows.

More specifically, when the low-frequency oscillation suppressing circuit 17 tries to suppress oscillation of a higher-frequency component of the signal L, the path Llh in which the low-frequency oscillation suppressing circuit 17 acts on the transistor 12 pass through a position close to the transistor 12 between the input matching circuits 14-1. Therefore, in order to widen a frequency band in which oscillation can be suppressed by the low-frequency oscillation suppressing circuit 17 on a high-frequency side as much as possible, the resistor 18 is preferably arranged at a position closest to the transistor 12 between the input matching circuits 14-1.

When the low-frequency oscillation suppressing circuit 17 tries to suppress oscillation of a lower-frequency component of the signal L, the path Lll in which the low-frequency oscillation suppressing circuit 17 acts on the transistor 12 pass through a position far from the transistor 12 between the input matching circuits 14-1. Therefore, in order to widen a frequency band in which oscillation can be suppressed by the low-frequency oscillation suppressing circuit 17 on a low-frequency side as much as possible, the resistor 18 is preferably arranged to have as large a length as possible between the input matching circuits 14-1.

Figure 8:
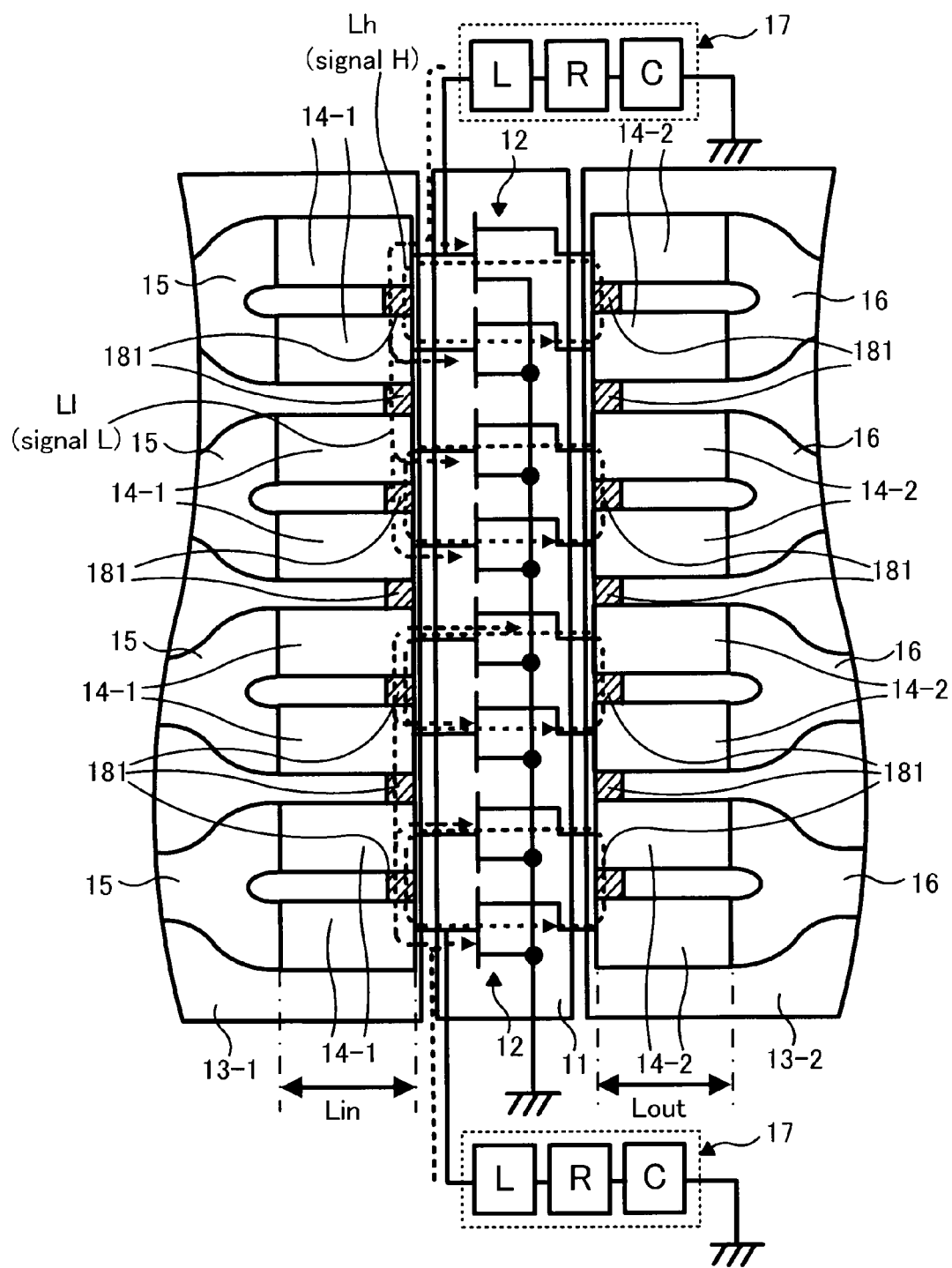
FIG. 8 is a top view schematically showing a main part of a high-frequency circuit according to a first comparative example of the embodiment of the present invention.

In order to suppress oscillation of a high oscillation frequency, a high-frequency circuit shown in FIG. 8 may be used. FIG. 8 is a top view schematically showing a main part of a high-frequency circuit according to a first comparative example of the high-frequency circuit of the embodiment. As shown in FIG. 8, oscillation at the high oscillation frequency occurs in the closed loop Lh including a position closest to the transistor 12 between the input matching circuits 14-1 and between the output matching circuits 14-2. Therefore, in the high-frequency circuit according to the first comparative example, a resistor 181 is arranged at only a position through which the closed loop Lh passes, i.e., the position closest to the transistor 12 between the input matching circuits 14-1 and between output matching circuits 14-2.

However, in the high-frequency circuit according to the first comparative example, the resistor 181 is formed at a position closest to the transistor 12 to have a length which is extremely short enough to suppress only oscillation at the high oscillation frequency. For this reason, it is understood that each of the resistors 181 on the path Ll in which the low-frequency oscillation suppressing circuit 17 operates is formed to have a narrow (small) width. Therefore, the resistance of the resistor 181 on a path Ll in which the low-frequency oscillation suppressing circuit 17 operates is large. Therefore, a combined resistance between the transistor 12 located near the center of the semiconductor substrate 11 and the low-frequency oscillation suppressing circuit 17 is also large. Therefore, the transistor 12 located near the center of the semiconductor substrate 11 and the low-frequency oscillation suppressing circuit 17 are not substantially connected to each other, and the low-frequency oscillation suppressing circuit 17 cannot be caused to act on the transistor 12 located near the center of the semiconductor substrate 11. More specifically, in the high-frequency circuit according to the first comparative example, oscillation at a low oscillation frequency is not suppressed.

Figure 9:
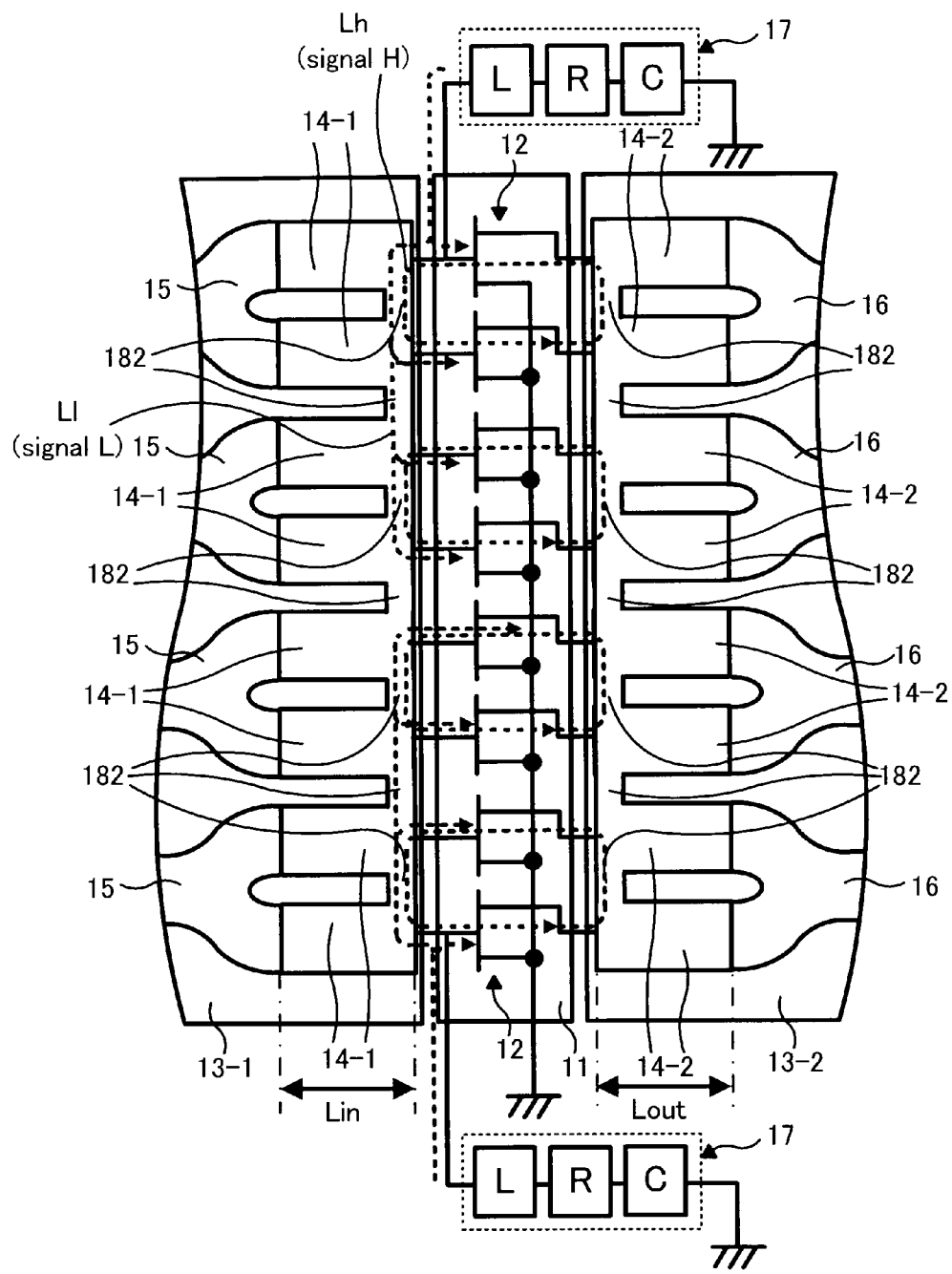
FIG. 9 is a top view schematically showing a main part of a high-frequency circuit according to a second comparative example of the embodiment of the present invention.

In order to suppress oscillation at the low oscillation frequency, the high-frequency circuit shown in FIG. 9 may be used. FIG. 9 is a top view schematically showing a main part of a high-frequency circuit according to a second comparative example of the high-frequency circuit according to the embodiment. As shown in FIG. 9, oscillation at a low oscillation frequency is suppressed by causing the low-frequency oscillation suppressing circuit 17 to act on the transistor 12. Therefore, in the high-frequency circuit according to the second comparative example, the resistor 181 shown in FIG. 8 is replaced with the input matching circuit 14-1 and the output matching circuit 14-2 by, for example, the same metal 182. In this case, the resistance of the metal 182 on the path Ll in which the low-frequency oscillation suppressing circuit 17 operates is small. Therefore, a combined resistance between the transistor 12 located near the center of the semiconductor substrate 11 and the low-frequency oscillation suppressing circuit 17 is also small. Therefore, the low-frequency oscillation suppressing circuit 17 can act on the transistor 12 located near the center of the semiconductor substrate 11.

However, in the high-frequency circuit according to the second comparative example, a resistor is not present in the closed loop Lh in which oscillation at a high oscillation frequency. Therefore, a signal at a high frequency transmitted through the closed loop cannot be attenuated. In the circuit shown in FIG. 9, oscillation at a high oscillation frequency can not be suppressed.

As described above, according to the high-frequency circuit of the embodiment, the resistors 18 (18a, 18b, and 18c) which are long enough to make it possible to suppress both oscillation at a high oscillation frequency and oscillation at a low oscillation frequency are arranged between input matching circuits 14-1 and between the output matching circuits 14-2. Therefore, oscillation at a high oscillation frequency is suppressed, and, at the same time, the low-frequency oscillation suppressing circuit 17 can cause to act on all the transistors 12. Therefore, according to the high oscillation frequency according to the embodiment, both oscillation at a high oscillation frequency and oscillation at a low oscillation frequency can be suppressed.

Since the resistors 18 are arranged between the input matching circuits 14-1 and between the output matching circuits 14-2, even though high-frequency signals input to the plurality of transistors 12 or high-frequency signals output from the plurality of transistors 12 have phase differences, electric power differences generated by the phase differences can be approximately uniformed through the resistor 18. Therefore, an electric power of the high-frequency signal output from the high-frequency circuit according to the embodiment is improved.

While certain embodiments have been described, these embodiments have been presented by way of example only, and are not intended to limit the scope of the inventions. Indeed, the novel high-frequency circuit described herein may be embodied in a variety of other forms. Furthermore, various omissions, substitutions and changes in the form of a high-frequency circuit described herein may be made without departing from the spirit of the inventions. The accompanying claims and their equivalents are intended to cover such forms or modifications as would fall within the scope and spirit of the inventions.

For example, the high-frequency circuit according to the embodiment has a plurality of divided input matching circuits and a plurality of divided output matching circuits, and can be applied to all high-frequency circuits having low-frequency oscillation suppressing circuits.

What is claimed is:

1. A high-frequency circuit comprising: a plurality of transistors formed arranged and formed on a semiconductor substrate in parallel to each other;
    a plurality of input matching circuits arranged on a first insulating substrate and connected to gate terminals of the plurality of transistors;
    a plurality of output matching circuits arranged on a second insulating substrate and connected to drain terminals of the plurality of transistors;
    a plurality of resistors formed between the plurality of input matching circuits and between the plurality of output matching circuits; and
    low-frequency oscillation suppressing circuits, each configured by a filter circuit having a desired transmission band and a resistor and each having one end connected to the respective gate terminal of the transistor located on a respective end of the plurality of transistors and having its other end grounded,
    wherein each of the resistors is formed to include a position closest to the transistors between the input matching circuits and between the output matching circuits, and each of the resistors has a length at which the low-frequency oscillation suppressing circuit can suppress oscillation at the lowest frequency in the transmission band.

2. The high-frequency circuit according to claim 1, wherein the resistor is an isolation resistor to attenuate a high-frequency signal transmitted on a closed loop including the two adjacent transistors and the two input matching circuits and the two output matching circuits connected to the transistors.

3. The high-frequency circuit according to claim 1, wherein the resistor is formed to have a length to fill in a portion between the input matching circuits and a portion between the output matching circuits.

4. The high-frequency circuit according to claim 1, wherein the resistor consists of a tantalum nitride or nichrome.

5. The high-frequency circuit according to claim 1, wherein the filter circuit of the low-frequency oscillation suppressing circuit is configured by a conductor and a capacitor connected to the gate terminal of the transistor, and a transmission band of the filter circuit is determined by an inductance of the conductor and a capacitance of the capacitor.

6. The high-frequency circuit according to claim 1, further comprising: a branching filter arranged on the first insulating substrate and connected to the plurality of input matching circuits; and a combining filter arranged on the second insulating substrate and connected to the plurality of output matching circuits.

7. The high-frequency circuit according to claim 1, wherein the resistor has a length different from the length of the input matching circuit and the output matching circuit.

8. The high-frequency circuit according to claim 7, wherein the resistor is shorter than the input matching circuit or the output matching circuit.

9. The high-frequency circuit according to claim 8, wherein the resistor is longer than a half the input matching circuit or the output matching circuit.

10. The high-frequency circuit according to claim 7, wherein the resistor is longer than the length of the input matching circuit or the output matching circuit.

* * * * *